United States Patent
Mehta et al.

(10) Patent No.: US 6,261,944 B1
(45) Date of Patent: *Jul. 17, 2001

(54) METHOD FOR FORMING A SEMICONDUCTOR DEVICE HAVING HIGH RELIABILITY PASSIVATION OVERLYING A MULTI-LEVEL INTERCONNECT

(75) Inventors: Sunil D. Mehta; Xiao-Yu Li, both of San Jose, CA (US)

(73) Assignee: Vantis Corporation, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,395

(22) Filed: Nov. 24, 1998

(51) Int. Cl.[7] ................................ H01L 21/4763
(52) U.S. Cl. .................. 438/624; 438/626; 438/631; 438/612
(58) Field of Search .................. 438/626, 631, 438/632, 633, 634, 645, 646, 697, 698, 699, 758, 760, 782, 958, 624, 106, 612, 614, 617

(56) References Cited

U.S. PATENT DOCUMENTS

| | | | |
|---|---|---|---|
| 5,128,279 | * | 7/1992 | Nariani et al. ............... 438/624 |
| 5,413,963 | * | 5/1995 | Yen et al. ................. 438/624 |
| 5,429,990 | * | 7/1995 | Liu et al. ................. 438/624 |
| 6,027,999 | * | 2/2000 | Wong ..................... 438/637 |

* cited by examiner

Primary Examiner—Charles Bowers
Assistant Examiner—Hsien-Ming Lee
(74) Attorney, Agent, or Firm—Brinks Hofer Gilson & Lione

(57) ABSTRACT

A semiconductor device having a high reliability passivation includes a planarization layer overlying a multi-level interconnect layer. The passivation layer has a planar surface upon which additional passivation layers are formed. Openings in the overlying passivation layers and the planarization layer expose bonding pads in the multi-level interconnect layer. In a process for fabricating the device, the planarization layer is preferably formed by dispensing a siloxane spin-on-glass (SOG) material onto the surface of the multi-level interconnect layer. The SOG is subsequently planarized to form a substantially planar surface.

23 Claims, 3 Drawing Sheets

METHOD FOR FORMING A SEMICONDUCTOR DEVICE HAVING HIGH RELIABILITY PASSIVATION OVERLYING A MULTI-LEVEL INTERCONNECT

FIELD OF INVENTION

This invention relates, in general, to semiconductor devices and to methods for their fabrication, and more particularly, to passivation layers for semiconductor devices having high-density, multi-level metal interconnects.

BACKGROUND OF THE INVENTION

In order to build faster and more complex integrated circuits, semiconductor device manufacturers have increased the number of components in to the integrated circuits, while reducing the overall size of the circuit. The small circuit size requires multiple overlying metal interconnect layers to electrically connect the vast number of components within the integrated circuit. The multi-level metal interconnects are necessary in order to provide the large quantity of electrical connections necessary to electrically couple the large number of device components to each other, and to electrical circuitry within device packaging.

With the advent of very-large-scale-integration (VLSI) semiconductor technology, multi-level interconnect layers must be fabricated at high density levels. Each metal interconnect layer includes a large number of metal leads arrayed over an interlevel dielectric layer. The individual metal leads are fabricated using high resolution photolithographic and etching methods to have a very small line width. A high packing density of metal leads is obtained by placing the leads very close together, such that a very small line-space pitch is achieved.

In addition to multiple layers of metal, VLSI semiconductor devices also include passivation materials overlying the interconnect layers to protect the underlying circuitry from contamination and from physical damage. Most commonly, multiple passivation layers are employed to relieve stress in the underlying metal and dielectric layers. Excessive stress can cause cracking and void formation in the interconnects resulting in the loss of electrical signals from the affected components within the device. The passivation materials are typically silicon oxides and silicon nitrides. Passivation materials, such as silicon nitride, are commonly used to prevent mobile ions from entering the device structures and causing problems, such as threshold voltage shifting in metal-oxide-semiconductor (MOS) transistors within the device.

As successive layers of conductors and dielectric materials are deposited over previously defined structures, the surface topography can become extremely uneven. The surface roughness is substantially increased when multi-level metal interconnects are used. Also, the requirement for high-density interconnects in VLSI devices further exacerbates the uneven surface topography upon which the passivation layers must be applied. At some point, the surface topography become so uneven that the passivation layers cannot uniformly coat the underlying interconnects. When this happens, voids and open spaces can be created below the passivation layers.

The creation of open spaces within the device is problematic because gases, such as water vapor, can easily collect within the open spaces. In the case of water vapor, water can condense within the open spaces and cause corrosion within the interconnect layers. Most VLSI devices employ a large number of metals, such as copper, copper-aluminum alloy, and the like, which are subject to corrosion upon contact with water. Additionally, gas pressure can build up within the spaces and cause a phenomenon known as "popcorn" cracking in package devices. When this occurs, high pressure gases literally explode out of the package damaging circuit elements in the process. Even in the rare case where a circuit element is not damaged, a leakage path for moisture is created as the outrushing gases create cracks in the various dielectric layers within the package. Once the cracks have been formed, the both moisture and mobile ions can penetrate the passivation layers and contaminate the underlying device components resulting in catastrophic device failure. Accordingly, a need existed for an improved passivation material and process to eliminate the formation of voids and open spaces at the passivation/interconnect interface.

SUMMARY OF THE INVENTION

In practicing the present invention, there is provided a semiconductor device having a high reliability passivation and a method for fabricating the device. The inventive device passivation includes a planarized layer, preferably formed with spin-on-glass (SOG) that is subsequently planarized to form a smooth surface. The planar surface provides a relatively flat surface upon which to further deposit additional passivation layers. Deposition onto a flat surface reduces the formation of voids and open spaces at the interface of the passivation and the underlying, multi-level interconnect layer. By minimizing the formation of voids and open spaces, premature device failure caused by exposure to harsh conditions during assembly and subsequent operation can be dramatically reduced.

In particular, devices fabricated in accordance with the invention show improved package reliability over devices fabricated by prior art methods. In comparison testing, semiconductor devices containing the inventive passivation showed improved reliability during temperate cycling steam pressure testing, thermal, and vibration shock testing and accelerated steam testing.

In one embodiment, the semiconductor device includes a substrate having a plurality of device components thereon. An electrical interconnect layer overlies the plurality of device components, and an insulation layer overlies the interconnect layer. A planarized layer of SOG overlies the insulation layer and at least one additional passivation layer overlies the SOG layer. A method for fabricating the device includes providing a semiconductor substrate having a device layer thereon, and having an interconnect layer overlying the device layer. The interconnect layer is characterized by a highly uneven upper surface. A stress relieving layer is formed to overlie the interconnect layer, and a planarized layer is formed to overlie the stress-relieving layer. Then, a protection layer is formed to overlie the planarized layer, and openings are formed through the protection layer, the planarized layer, and the stress relieving layer. The openings exposed contact surface regions on the interconnect layer to which external device leads can be connected.

Figure 1:
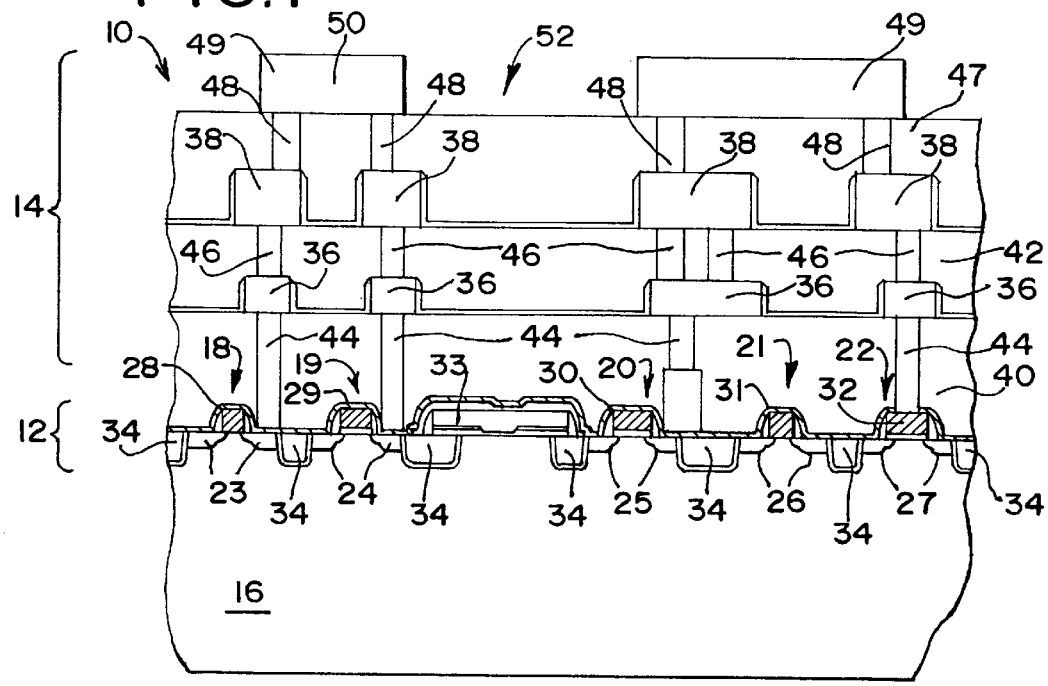
FIGS. 1–5 illustrate, in cross-section, various processing steps in accordance with the invention for the fabrication of high reliability passivation layers in a semiconductor device.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF THE PREFERRED EMBODIMENTS

The present invention is for a semiconductor device and for a method for forming the semiconductor device where the device shows improved package reliability. Through the use of a planarized layer within the passivation overlying a multi-level metal interconnect layer, high quality passivation is obtained. In one embodiment of the invention, a stress relieving layer is placed over the uppermost metal interconnect in a multi-level metal interconnect layer. A planarization material is then applied over the stress relieving layer, and a planarization process is carried out to form a substantially smooth surface. Subsequently, other dielectric materials can be applied over the top of the planarized layer to form high-reliability protective passivation overlying the multi-level metal interconnect. In a preferred embodiment of the invention, the planarization material is a spin-on-glass, such as siloxane or a silicate, or the like. Application of the inventive planarization process shows improved device reliability through a dramatic reduction in package failures. By applying a planarization material and process to the device passivation system, failures associated with moisture penetration are dramatically reduced. The reduction in moisture induced failures is believed to result from the elimination of voids and open pockets are the passivation/metal interconnect interface. Reducing the number of voids necessarily reduces the locations at the interface where gases, such as water vapor, can become trapped. These and other advantages of the invention will become more apparent upon the further description of a preferred embodiment for practicing the present invention.

Shown in FIG. 1, in cross-section, is a portion of a semiconductor device 10 having already undergone several processing steps. Generally, the structure illustrated in FIG. 1 includes a device layer 12, and an interconnect layer 14 overlying device layer 12. Device layer 12 includes a number of semiconductor device components formed near the upper surface of a semiconductor substrate 16. For purposes of illustration, device layer 12 includes MOS transistors 18, 19, 20, 21, and 22. The MOS transistors further include source and drain regions 23, 24, 25, 26, and 27, and gate electrodes 28, 29, 30, 31, and 32. Also, a floating-gate electrode 33 resides intermediate to gate electrodes 29 and 30. The MOS transistors are electrically isolated from each other by trench isolation structures 34. It is important to note that the device structures illustrated in device layer 12 are representative structures commonly found in MOS integrated circuit devices, such as programmable logic devices (PLDs), and the like. Those skilled in the art will appreciate that many other such structures can be included, such as buried resistors, diodes, and the like.

Interconnect layer 14 is a multi-level metal interconnect system typically used in VLSI integrated circuit technology. By means of illustrative example, interconnect layer 14 includes a first patterned metal interconnect layer 36 and a second patterned metal interconnect layer 38. Portions of first metal interconnect layer 36 are separated from device layer 12 by a first inter-level-dielectric (ILD) layer 40. Also, portions of second metal interconnect layer 38 are separated from first metal interconnect layer 36 by a second ILD layer 42.

In state-of-the-art VLSI semiconductor devices, many structures, such as that illustrated in FIG. 1, are packed into extremely small substrate surface areas. While the high packaging density is necessary to provide large numbers of functions and enhance performance, the high packaging density results in extremely high aspect ratios for openings formed in insulation layers, such as first ILD layer 40 and second ILD layer 42. As illustrated in FIG. 1, first patterned metal interconnect layer 36 is coupled to source and drain regions 23, 24, 25, and to gate electrode 32 by filled vias 44 formed in first ILD layer 40. Further, second patterned metal interconnect layer 38 is coupled to first patterned metal interconnect layer 36 by filled vias 46 formed in second ILD layer 42.

The aspect ratio of an opening is defined as the ratio of the height of the opening to the diameter of the opening. In many VLSI devices, openings such as filled vias 44 and 46 have aspect ratios on the order of about 1 to 4. Advanced metalization and contact formation technology is necessary to form high aspect ratio openings for metal interconnect layers.

In addition to high aspect ratios, the formation of metal interconnect layers for advanced semiconductor devices requires fabrication of metal interconnects having extremely small feature size and small separation distances between adjacent portions of individual metal interconnect leads. For example, a third patterned metal interconnect layer 49 is formed to have a portion 50 that is separated from remaining portions of second metal interconnect layer 49 by a space 52. In a typical VLSI semiconductor device, space 52 can have lateral dimension on the order of about 0.25 to 0.75 microns. Precise dielectric passivation overfill is necessary to minimize the creation of voids at space 52.

Figure 2:
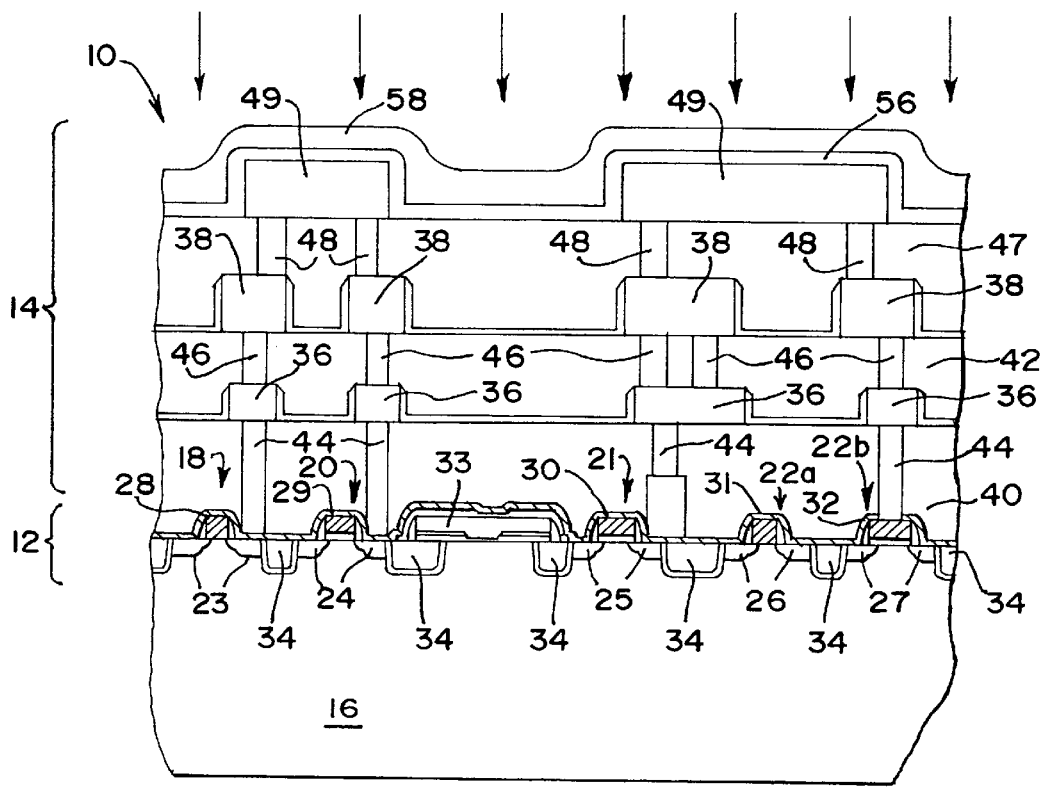

In the manner described above, successive layers of interconnect metal and ILD can be formed. As will now be described, the present invention employs a planarization material and method to prevent the formation of gas-trapping voids in space 52. After forming a third ILD layer 47 and filled vias 48, a third patterned metal interconnect layer 49 is formed to overlie third ILD layer 47. To prepare the upper surface of third patterned metal interconnect layer 48 for passivation, a stress relieving layer 56 is formed to overlie third patterned metal interconnect layer 49, as shown in FIG. 2. Preferably, a conformal stress relieving layer 56 of silicon oxide is formed by plasma-enhanced-chemical-vapor-deposition (PECVD) to a thickness of a preferably about 1000 to 4000 angstroms, and more preferably to about 2000 angstroms.

After forming stress relieving layer 56, a planarization layer 58 is formed to overlie stress relieving layer 56. In a preferred embodiment, planarization layer 58 is a spin-on-glass (SOG) material, such as siloxane, or silicate, or the like. Where the SOG is a siloxane, suitable siloxane materials are commercially available from Allied Signal Corporation, Sunnyvale, Calif., and known by the trade name "ACCUGLASS" and sold under the product numbers SOG-211 and SOG-314. Those skilled in the art will appreciate that many different SOG materials are available and commonly used in semiconductor fabrication. Although the particular siloxane SOG previously described represents a preferred material, other commonly available SOG materials can be used and are within the scope of the present invention.

In the preferred embodiment, SOG is applied to semiconductor substrate 16 by rapidly spinning the substrate at about 3000 to 3400 rpm, dispensed layer thickness of about 2000 to 4000 angstroms on stress relieving layer 56. Next, the dispensed SOG layer is cured by thermal processing, preferably at a temperature of about 400 to 450° C. and more preferably at a temperature of about 430° C. The curing process is preferably carried out in an atmospheric furnace. The curing process drives off moisture and entrained gases within the dispensed SOG material. The curing process renders the dispensed SOG more stable and prevents the unwanted formation of voids in the SOG film.

To further stabilize the dispensed SOG, an optional ion implantation process can be carried out to further harden the SOG and force remaining entrained gases out of the deposited film. In the alternative process, an ion implantation procedure is carried out to implant dopant atoms into the cured SOG. Preferably, heavy dopant atoms are implanted into the cured SOG film. The implantation process transfers ion energy into the film, such that internal thermal curing and outgassing take place. In one embodiment, arsenic is implanted into the cured SOG to a dose of about 5.0 E15 ions per square centimeter at an implantation energy of about 80 keV.

Figure 3:
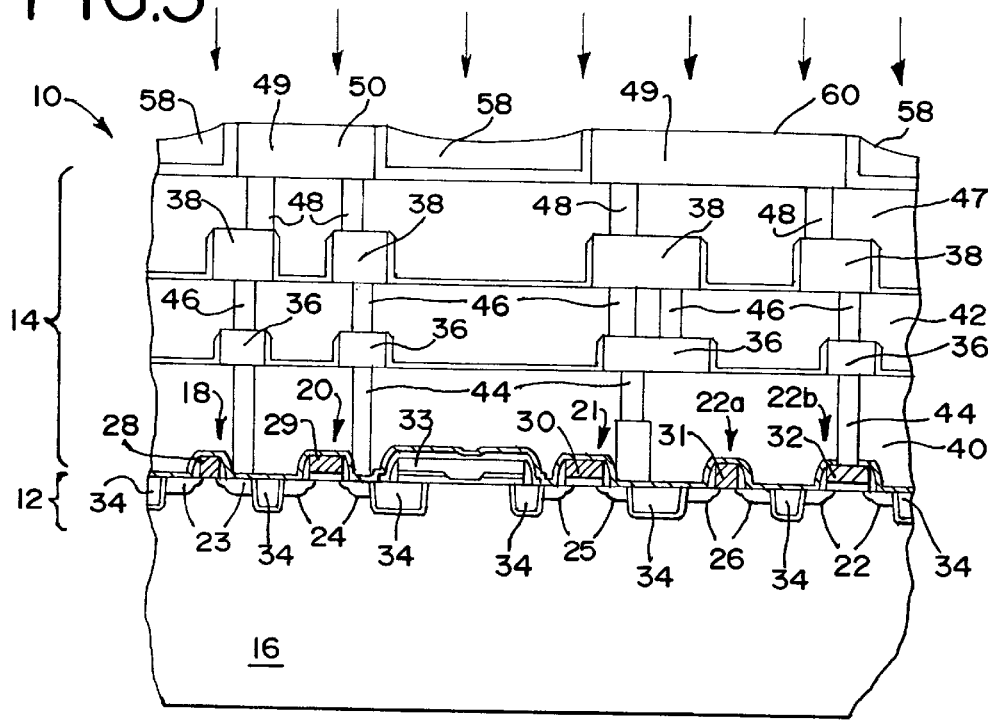

Regardless of whether or not the optional post-deposition hardening process is used, the inventive process continues by uniformly removing a surface portion of planarization layer 58 and stress relieving layer 56 to form a substantially smooth surface 60, as illustrated in FIG. 3. The removal of a surface portion of planarization layer 58 and stress relieving layer 56 can be carried out by several commonly used planarizing processes. In a preferred embodiment of the invention, planar surface 60 is formed by anisotropical etching. Where planarization layer 58 is an SOG material, reactive ion etching (RIE) is carried out using fluorine-based etching chemistry. Preferably, a mixture of carbontetrafluoride ($CF_4$) and trifloralmethane ($CHF_3$) is used to remove about 2500 to 300 angstroms of the SOG material.

Although anisotropic etching is the preferred planarization technique, those skilled in the art will appreciate that other planarization methods can be used, such as chemical-mechanical-polishing (CMP), photoresist deposition and etchback, and the like. Those skilled in the art will appreciate that the particular material composition of planarization layer 58 will determine the chemical compounds necessary to perform either RIE or CMP processes. For example, in the case of siloxane SOG, a chemical slurry containing fluorinated components is used to form a CMP polishing slurry. Also, in the case of photoresist deposition and etchback, etching chemistries must be selected that remove both photoresist and planarization material at approximately the same etch rate. In this case a nonselective etching chemistry that etches carbon containing photoresist and silicon oxide at approximately the same rate must be used.

Once planar surface 60 has been formed, an optional hardening process can be carried out to harden planarization layer 58. The previously described ion implantation process can be used to harden planarization layer 58 after the etchback process is complete. Again, preferably, heavy atoms, such as arsenic, or phosphorus, or the like, are ion implanted at a dose of about 5.0 E15 ions per square centimeter at about 80 keV. It is important to note that the optional hardening process performed after planarization can be either exclusive of, or in addition to, the previously described hardening process performed prior to etching back planarization layer 58.

In accordance with the invention, the formation of planar surface 60 provides a substantially smooth surface for the formation of subsequent passivation layers. As previously described, the high density geometry of second metal interconnect layer 38, together with the high aspect ratio of the various contact and via openings present in the ILD layers, results in an extremely uneven top surface. The high surface contrast encountered in semiconductor devices having high density, multi-level metal interconnect layers can easily create voids between the various metal layers that trap unwanted gases within the semiconductor device. By depositing a planarizing material, such as SOG, the small gaps and spaces are filled by the planarizing material eliminating voids and open areas in the multi-level metal interconnect structure. Additionally, by planarizing the SOG, a substantially smooth surface is provided for the formation of subsequent passivation layers. The subsequently deposited layers will not be populated by voids and open spaces between the layers that can now be deposited on planar surface 60.

Figure 4:
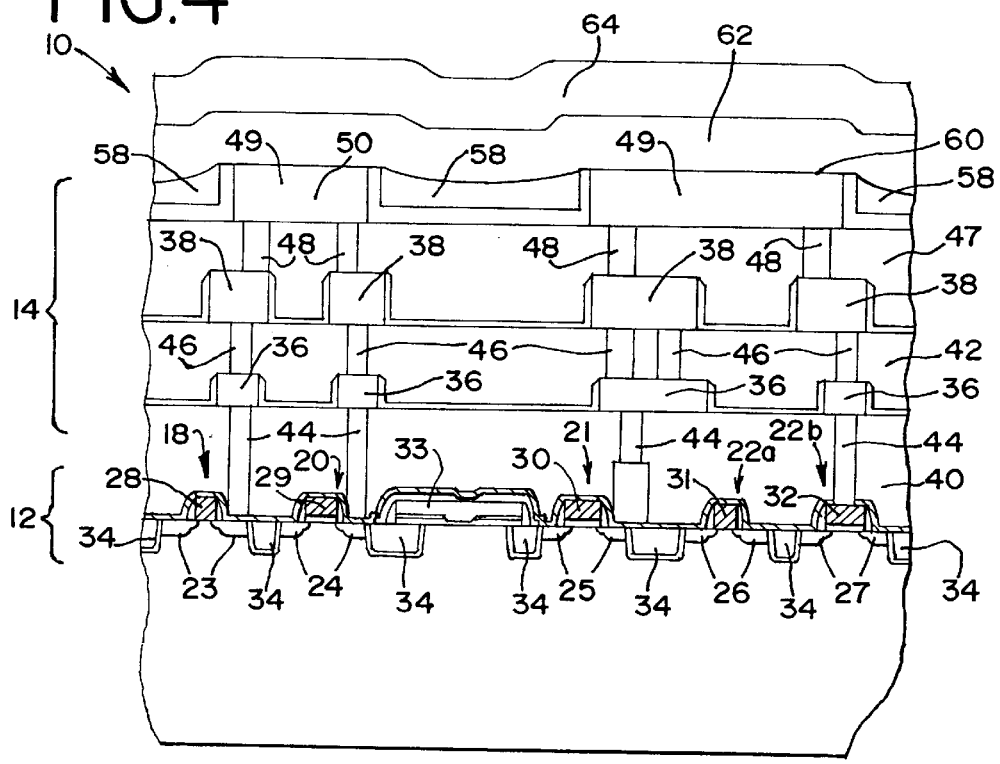

The inventive process continues, as shown in FIG. 4, with the deposition of a first passivation layer 62 and a second passivation layer 64. First passivation layer 62 is preferably a silicon oxide deposited by PECVD preferably to a thickness of about 2000 to 10,000 angstroms, and more preferably to a thickness of about 3000 angstroms. Once first passivation layer 62 is deposited, second passivation layer 64 is deposited to overlie first passivation layer 62. Second passivation layer 64 is preferably silicon nitride ($Si_3N_4$) deposited by PECVD preferably to a thickness of about 5000 to 10,000 angstroms, and more preferably to a thickness of about 7000 angstroms. First and second passivation layers 62 and 64 function to protect interconnect layer 14 and device layer 12 from contamination by performance-degrading elements, such as sodium, and the like. Additionally, phosphorus may be added to first passivation layer 62 to retard mobile-ion migration into the underlying interconnect layer. Typically, a silicon oxide passivation layer, such as first passivation layer 62, will contain no more than about four weight percent phosphorus. Both passivation layers 62 and 64 are formed by PECVD to reduce unwanted diffusion of dopant atoms in doped regions previously formed within semiconductor device 10.

Figure 5:
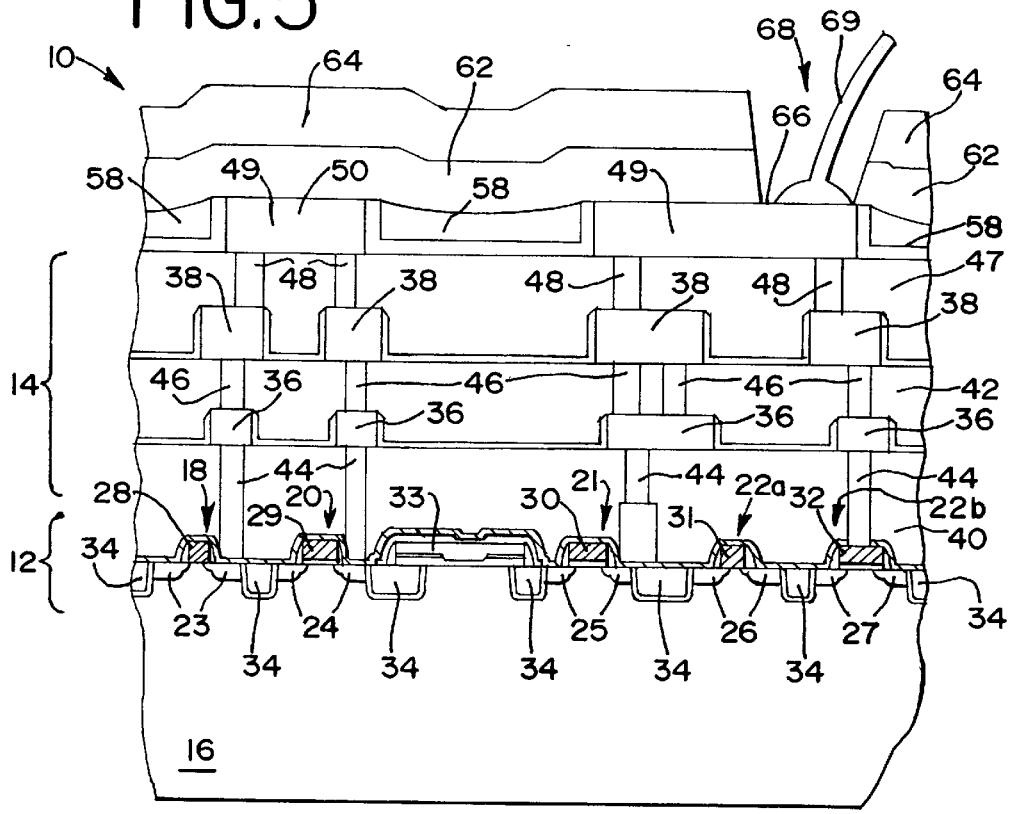

Once the passivation layers have been formed, a photolithographic pattern (not shown) is formed on second passivation layer 64, and an etching process is carried out to form openings through the various insulation layers and passivation layers overlying third metal interconnect layer 49. As illustrated in FIG. 5, a bond pad area 66 is exposed by an opening 68 formed and the insulation and passivation layers overlying second metal interconnect 38. A device lead 69 is electrically connected to bond pad 66. Device lead 69 electrically couples circuitry within a device package to the various device components in semiconductor device 10. Those skilled in the art will appreciate that device lead 69 can be formed by a number of known processes, such as wire bonding, tape-automated-bonding (TAB), and the like. In a VLSI semiconductor device, a large plurality of bond pads and device leads, such as bond pad 66 and device lead 69, are formed to electrically connect semiconductor device 10 to packaging circuitry. The packaging circuitry is, in turn, electrically connected to package leads that protrude outside of the device package. The package leads are subsequently electrically connected to printed circuit boards, and the like, to electrically couple semiconductor device 10 into an electronic system within which semiconductor device 10 is but one of many such devices.

Figure 6:
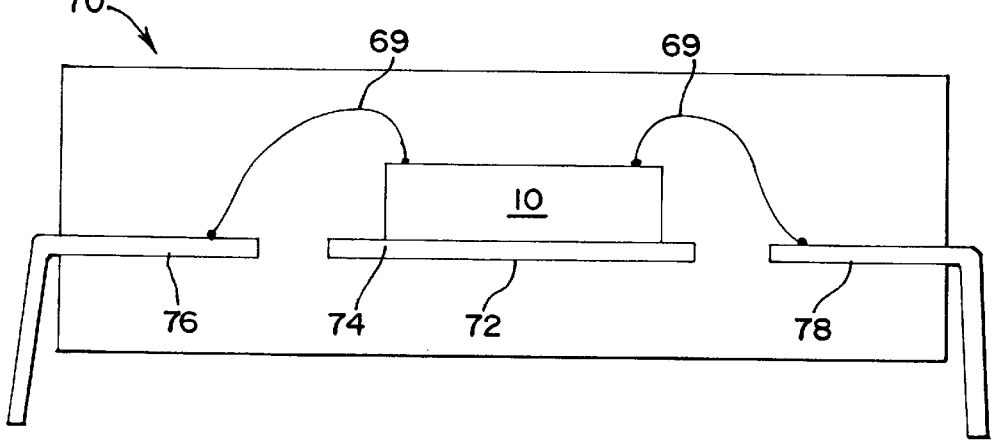
FIG. 6 illustrates, in cross-section, a device package incorporating a semiconductor device fabricated in accordance with the invention.

Shown in FIG. 6, in cross-section, is an exemplary device package 70. Semiconductor device 10 is mounted to a lead frame 72 positioned within device package 70. Lead frame 72 includes a flag 74 to which semiconductor device 10 is attached, and package leads 76 and 78. Device leads 69 connect semiconductor device 10 to package leads 76 and 78, respectively. Once device package 70 is installed in an electronic system, device package 70 can be subjected to extreme temperature and humidity conditions. The long term reliability of semiconductor device 10 within device package 70 is substantially enhanced by the planarization layer of the present invention. The results of reliability testing carried out with a packaged semiconductor device similar to the device and package illustrated herein are shown in Table I.

TABLE I

|  | Temp Pres-Cycle | Steam sure | preconditioning test P/C | thermal shock TS | HAST accelerated humidity stress test/g |
|---|---|---|---|---|---|
| SOG Process | 0/50 | 0/50 | 0/149 | 0/32 | 0/50 |
| REFERENECE I | 21/50 | 1/50 | 3/150 | 1/32 | 0/50 |
| REFERENCE II | 1/50 | 0/50 | 1/150 | 1/32 | 1/50 |

The particular device tested included MOS transistors, such as MOS transistor 18 having a gate length of about 0.30 microns. Also, the device tested included a plurality of bond pads, such as bond pads 66, having a pad pitch of approximately 70 microns. During testing, the package leads were inserted into a test board and the package and board were, in turn, inserted into a testing chamber. Once in the testing chamber, a series of reliability tests were carried out including, temperature cycling, exposure to pressurized steam, and accelerated humidity stress testing. For comparison, Table I shows results obtained from packaged devices containing semiconductor devices fabricated in accordance with prior art processes. These prior art devices are identified as "Reference I," and "Reference II."

The first column illustrates the results for temperature cycling, in which the devices were subjected to steadily changing temperature ranging from about −40° C. to about 150° C. The complete test protocol included 1000 such temperature cycles. As noted, out of 50 samples tested none of the devices fabricated with the inventive SOG process failed under temperature cycle testing.

The second column of Table I illustrates the results for steam pressure testing. To carry out the steam pressure test, devices were subjected to a continuous steam pressure of about 15 psi at a temperature of about 121° C. for a period of 168 hours. As noted, none of the devices fabricated with the inventive SOG process failed in the steam pressure testing.

The third column shows the results for preconditioning testing with moisture and heat carried out to simulate environmental conditions to which the devices are subjected to during assembly operations. To simulate assembly operations, the devices were soaked in a moist environment at an elevated temperature followed by three cycles of either vapor phase reflow, or infrared/convective temperature exposure. As noted, out of 149 samples, none of the devices fabricated with the inventive SOG process failed.

The fourth column shows the results thermal shock testing. In this test, the devices were subjected to a temperature change from −55° C. to 125° C. in less than about 10 seconds. As indicated, none of the devices fabricated with the inventive process failed.

Finally, the last column shows the results of accelerated humidity stress testing. Under this test, the devices were subjected to a humidity level of about 85% and a temperature of about 140 to 160° C. for a period of about 96 hours. The devices were then dried out at room temperature for about 3 hours. Again, none of the devices formed by the inventive process failed.

Thus, it is apparent that there has been provided, in accordance with the invention, a device having high reliability passivation and a method for forming the device that fully meets the advantages set for the above. Although the invention has been described and illustrated with reference to specific illustrative embodiments thereof, it is not intended that the invention be limited to those illustrative embodiments. Those skilled in the art will recognize the variations and modifications can be made without departing from the spirit of the invention. For example, many different contact metalization schemes can be used to form the contacts between metal interconnect layers and the device layers. Additionally, many more metal interconnect layers can be fabricated in addition to the two metal interconnect layers described in the foregoing embodiment. It is therefore intended to include within the invention all such variations and modifications within the scope of the appended claims and equivalents thereof.

What is claimed is:

1. A method for forming a semiconductor device comprising the steps of:
   providing a semiconductor substrate having a plurality of patterned metal layers thereon, wherein each of the patterned metal layers is separated by a dielectric layer;
   forming a plasma oxide layer overlying the plurality of patterned metal layers;
   forming a planarization layer overlying the plasma oxide layer;
   applying thermal energy to anneal the planarization layer;
   removing a portion of the planarization layer to form a substantially flat surface;
   hardening the planarization layer, after removing the portion of the planarization layer;
   forming a plasma oxide layer overlying the planarization layer; and
   forming a plasma nitride layer overlying the plasma oxide layer.

2. The method of claim 1 further comprising the step of hardening the planarization layer prior to removing a portion of the planarization layer.

3. The method of claim 2, wherein the step of hardening the planarization layer comprises ion implanting a dopant species into the planarization layer.

4. The method of claim 3, wherein the step of ion implanting a dopant species comprises ion implanting a dopant series selected from the group consisting of arsenic and phosphorus.

5. The method of claim 1, wherein the step of forming a planarization layer comprises spin coating a liquid material onto the plasma oxide layer.

6. The method of claim 5, wherein the step of spin coating a liquid material comprises spin coating a siloxane material.

7. The method of claim 1, wherein the step of hardening the planarization layer comprises ion implanting a dopant species into the planarization layer.

8. The method of claim 7, wherein the step of ion implanting a dopant species comprises ion implanting a dopant species.

9. A method for fabricating a semiconductor device comprising the steps of:
  providing a semiconductor substrate having a device layer thereon, and having an interconnect layer overlying the device layer,
    wherein the interconnect layer is characterized by uneven surface regions;
    forming a stress relieving layer overlying the interconnect layer;
    spin coating a glass material onto the stress relieving layer to form a uniform layer;
    removing a surface portion of the uniform layer;
    hardening the uniform layer after removing the surface portion;
    forming a protection layer overlying the planarized layer; and
    forming openings through the protection layer, the planarized layer, and the stress relieving layer to expose contact surface regions on the interconnect layer.

10. The method of claim 9, wherein the step of spin coating a glass material comprises the steps of:
  providing a siloxane liquid; and
  dispensing the siloxane liquid onto the semiconductor substrate to form a uniform layer overlying the stress relieving layer.

11. The method of claim 9 further comprising the step of curing the uniform layer.

12. The method of claim 11 wherein the step of hardening the planarized layer comprises the step of introducing a dopant into the uniform layer to harden the uniform layer.

13. The method of claim 9, wherein the step of removing a surface portion of the uniform layer comprises the step of plasma etching the surface portion of the uniform layer to form a planarized layer.

14. A method for fabricating high-density passivation layers in a semiconductor device, wherein the semiconductor device includes a device layer and a multi-level interconnect layer overlying the device layer, and wherein the multi-level interconnect layer is characterized by uneven surface regions, the method comprising the steps of:
  forming a stress relieving layer overlying the multi-level interconnect layer;
  forming a planarization layer overlying the stress relieving layer;
  removing surface portions of the planarization layer and the stress relieving layer to form a substantially smooth surface hardening the planarization layer after removing the surface portion of the planarization layer; and
  forming at least one passivation layer overlying the substantially smooth surface.

15. The method of claim 14, wherein the step of forming a planarization layer comprises spin coating a glass material onto the stress relieving layer to form a uniform layer.

16. The method of claim 15, wherein the step of spin coating a glass material comprises the steps of:
  providing a siloxane liquid; and
  dispensing the siloxane liquid onto the semiconductor substrate.

17. The method of claim 15 further comprising the step of curing the uniform layer.

18. The method of claim 17 further comprising the step of hardening the uniform layer by introducing a dopant into the uniform layer.

19. The method of claim 14, wherein the step removing surface portions of the planarization layer and the stress relieving layer comprises a process selected from the group consisting of plasma etching and CMP.

20. The method of claim 14, wherein the step of forming a stress relieving layer comprises PECVD of silicon oxide.

21. The method of claim 14, wherein the step of forming at least one passivation layer comprises PECVD of silicon oxide.

22. The method of claim 14 further comprising the step of forming openings through the at least one passivation layer, the planarized layer, and the stress relieving layer to expose bond pad regions on the multi-level interconnect layer.

23. The method of claim 14 further comprising the step of introducing phosphorus into the at least one passivation layer.

* * * * *

UNITED STATES PATENT AND TRADEMARK OFFICE
CERTIFICATE OF CORRECTION

PATENT NO. : 6,261,944 B1
DATED : July 17, 2001
INVENTOR(S) : Mehta et al.

It is certified that error appears in the above-identified patent and that said Letters Patent is hereby corrected as shown below:

<u>Column 10,</u>
Line 8, "portion" should be -- portions --

Signed and Sealed this

Twenty-sixth Day of February, 2002

Attest:

Attesting Officer

JAMES E. ROGAN
Director of the United States Patent and Trademark Office